(12) United States Patent
Reboh et al.

(10) Patent No.: US 9,761,607 B2
(45) Date of Patent: Sep. 12, 2017

(54) METHOD FOR PRODUCING STRAINED SEMI-CONDUCTOR BLOCKS ON THE INSULATING LAYER OF A SEMI-CONDUCTOR ON INSULATOR SUBSTRATE

(71) Applicant: COMMISSARIAT A L'ENERGIE ATOMIQUE ET AUX ENE ALT, Paris (FR)

(72) Inventors: Shay Reboh, Sassenage (FR); Perrine Batude, Dijon (FR); Sylvain Maitrejean, Grenoble (FR); Frederic Mazen, Saint Egreve (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/579,069

(22) Filed: Dec. 22, 2014

(65) Prior Publication Data

US 2015/0179665 A1 Jun. 25, 2015

(30) Foreign Application Priority Data

Dec. 23, 2013 (FR) .................... 13 63418

(51) Int. Cl.
*H01L 21/00* (2006.01)
*H01L 29/66* (2006.01)
(Continued)

(52) U.S. Cl.
CPC ...... *H01L 27/1203* (2013.01); *H01L 21/0217* (2013.01); *H01L 21/02115* (2013.01);
(Continued)

(58) Field of Classification Search
CPC ............ H01L 21/8238; H01L 27/0922; H01L 27/11807; H01L 2027/11807;
(Continued)

(56) References Cited

U.S. PATENT DOCUMENTS

| | | |
|---|---|---|
| 2007/0012960 A1 | 1/2007 | Knoefler et al. |
| 2008/0124858 A1 | 5/2008 | Nguyen et al. |

(Continued)

FOREIGN PATENT DOCUMENTS

WO   WO 2008/014032 A1   1/2008

OTHER PUBLICATIONS

U.S. Appl. No. 14/849,060, filed Sep. 9, 2015, Maitrejean, et al.
(Continued)

*Primary Examiner* — Julio J Maldonado
*Assistant Examiner* — Moin Rahman
(74) *Attorney, Agent, or Firm* — Oblon, McClelland, Maier & Neustadt, L.L.P.

(57) ABSTRACT

A method for producing a microelectronic device is provided, including forming on an insulating layer of a semi-conductor on insulator type substrate, a first semi-conductor block covered with a first strain zone configured to induce a compressive strain in the first block and a second semi-conductor block covered with a second strain zone configured to induce a tensile strain in the second block, the first block and the second block each being formed of a lower region based on amorphous semi-conductor material, covered with an upper region of crystalline semi-conductor material in contact with one of the strain zones; and recrystallizing the lower region of the first and second blocks while using the upper region of crystalline material as starting zone for a recrystallization front.

10 Claims, 10 Drawing Sheets

(51) Int. Cl.

| | |
|---|---|
| *H01L 27/12* | (2006.01) |
| *H01L 21/02* | (2006.01) |
| *H01L 21/306* | (2006.01) |
| *H01L 29/04* | (2006.01) |
| *H01L 29/78* | (2006.01) |
| *H01L 21/84* | (2006.01) |
| *H01L 21/762* | (2006.01) |
| *H01L 27/092* | (2006.01) |
| *H01L 21/265* | (2006.01) |
| *H01L 21/8238* | (2006.01) |

(52) U.S. Cl.
CPC .. *H01L 21/02186* (2013.01); *H01L 21/02422* (2013.01); *H01L 21/02532* (2013.01); *H01L 21/02609* (2013.01); *H01L 21/02667* (2013.01); *H01L 21/30604* (2013.01); *H01L 21/76251* (2013.01); *H01L 21/84* (2013.01); *H01L 29/04* (2013.01); *H01L 29/7843* (2013.01); *H01L 29/7847* (2013.01); *H01L 21/26506* (2013.01); *H01L 21/823807* (2013.01); *H01L 27/092* (2013.01)

(58) Field of Classification Search
CPC ........... H01L 21/76897; H01L 21/8224; H01L 21/8228; H01L 21/8234; H01L 21/823885; H01L 29/0847; H01L 29/42316; H01L 29/42384; H01L 29/66
USPC .......... 257/20, 194, 135–136, 213–413, 900, 257/902–903; 438/136, 137, 156, 173, 438/192, 206, 212, 424, 427, 428, 591
See application file for complete search history.

(56) References Cited

U.S. PATENT DOCUMENTS

| | | | |
|---|---|---|---|
| 2008/0142855 A1* | 6/2008 | Ikeda | H01L 21/823412 257/288 |
| 2011/0210427 A1* | 9/2011 | Hoentschel | H01L 21/3081 257/622 |
| 2012/0068267 A1* | 3/2012 | Bedell | H01L 21/84 257/350 |
| 2015/0044828 A1 | 2/2015 | Batude et al. | |
| 2015/0044841 A1 | 2/2015 | Batude et al. | |

OTHER PUBLICATIONS

U.S. Appl. No. 14/575,329, filed Dec. 18, 2014, Maitrejean, et al.
French Preliminary Search Report issued Sep. 30, 2014 in Application No. FR 1363418.
James B. Kuo, et al., "2.4 Isolation Technology" CMOS VLSI Engineering Silicon-on-Insulator (SOI), XP055142890, 1998, 4 pages.
Scott E. Thompson, et al., "Uniaxial-Process-Induced Strained-Si: Extending the CMOS Roadmap" IEEE Transactions on Electron Devices, vol. 53, No. 5, XP002730256, May 2006, pp. 1010-1020.
T. Tezuka, et al., "Fabrication of strained Si on an ultrathin SiGe-on-insulator virtual substrate with a high-Ge fraction" Applied Physics Letters, vol. 79, No. 12, 2001, 4 pages.
B. Vincent, et al., "The Ge condensation technique: A solution for planar SOI/GeOI co-integration for advanced CMOS technologies?" Materials Science in Semiconductor Processing, vol. 11, 2008, pp. 205-213.
J. M. Hartmann, et al., "Critical thickness for plastic relaxation of SiGe on Si(001) revisited" Journal of Applied Physics, vol. 110, 2011, 9 pages.
U.S. Appl. No. 14/791,713, filed Jul. 6, 2015, Reboh, et al.

* cited by examiner

METHOD FOR PRODUCING STRAINED SEMI-CONDUCTOR BLOCKS ON THE INSULATING LAYER OF A SEMI-CONDUCTOR ON INSULATOR SUBSTRATE

TECHNICAL FIELD AND PRIOR ART

The present description relates to the field of structures formed of a semi-conductor on insulator type substrate, and more particularly that of devices provided with a semi-conductor on insulator type substrate on which several semi-conducting zones having different mechanical strains or undergoing different deformations are formed.

Mechanical deformation is taken to mean a material that has its crystalline lattice parameter(s) lengthened or shortened.

In the case where the deformed lattice parameter is larger than what is termed the "natural" parameter of the crystalline material, this is known as tensile deformation. When the deformed lattice parameter is smaller than the natural lattice parameter, the material is known as compressive deformation.

These mechanical deformation states are associated with mechanical strain states. However, it is also common to refer to these deformation states as mechanical strain states. In the remainder of the present application, this notion of deformation will be designated in a generic manner by the term "strain".

For certain applications, in particular for the production of transistors, it may be advantageous to provide a layer of strained semi-conductor material.

A tensile or compressive strain on a semi-conducting layer makes it possible to induce an increase in the velocity of the charge carriers, thereby improving the performances of devices with transistors formed in such a layer.

A semi-conductor on insulator type substrate is commonly formed of a support layer covered by, and in contact with, an insulating layer, itself covered by, and in contact with, a superficial semi-conducting layer generally intended to serve as active layer that is to say in which at least part of electronic components such as transistors is intended to be formed.

It is known to produce strained semi-conductor on isolator type substrates, in which the material of the superficial semi-conducting layer resting on the insulating layer is based on a strained material.

It is known for example to produce sSOI (for "strained Silicon On Insulator") type substrates comprising a superficial layer of silicon tensile strained in the plane in which N-type transistors having improved performances can be formed. Such a strain is however unfavourable to P-type transistors.

It is also known to produce devices in which, on a same support, one or more transistors are tensile strained whereas one or more transistors are compressive strained.

The document US 2012/00682671 A1 provides for example a method in which a tensile strained NMOS type transistor and a compressive strained PMOS type transistor are formed on a same substrate.

In this method, to form a tensile strained semi-conductor block, a zone of SiGe is formed on a block of Si on isolator in which is rendered amorphous a lower region that is then recrystallized. During the recrystallization, the SiGe imposes its lattice parameter on the Si in order to form a tensile strained semi-conductor block intended to form a channel of an N-type transistor. Another block of Si intended to form a channel of a P-type transistor is for its part compressive strained through an enrichment in germanium.

Such a method has the drawback of being limited to the tensile straining of Si and to the compressive straining of SiGe, and requiring for this to carry out a growth of SiGe which can prove to be both costly and difficult to implement.

Furthermore, such a method requires numerous steps and especially having to use different methods to achieve tensile straining and compressive straining.

The problem is posed of finding a novel method enabling the implementation, on a same substrate, of semi-conducting zones having different strains and which does not comprise the aforementioned drawbacks.

DESCRIPTION OF THE INVENTION

The present invention firstly relates to a method for producing a semi-conductor structure comprising the steps consisting in a) forming on a layer based on amorphous material, a first semi-conductor block covered with a first strain zone based on a tensile strained amorphous material adapted to induce a first strain state in said first block and a second semi-conductor block covered with a second strain zone based on a compressive strained amorphous material adapted to induce a second strain state in said second block, the first block being formed of a lower region based on amorphous semi-conductor material, covered with an upper region of crystalline semi-conductor material in contact with said first strain zone, the second block being formed of a lower region based on amorphous semi-conductor material, the lower region being covered with an upper region of crystalline semi-conductor material in contact with the second strain zone, b) recrystallizing the lower region of the first block and the lower region of the second block while using the upper region of crystalline material as starting zone for a recrystallization front.

The layer of amorphous material on which the first block and the second block are formed, may be an insulating layer of a semi-conductor on insulator type substrate.

The upper regions of crystalline semi-conductor material of the first block and of the second block which are not rendered amorphous are, because of their proximity with the strain zones, those of the semi-conductor blocks in which the deformations in the plane are the greatest.

These strained crystalline regions are used as starting seeds for a recrystallization of the lower regions of the semi-conductor blocks in order to impose the lattice parameter from the upper regions on the lower regions and thereby create a permanent elastic deformation in the lower regions.

A method in which amorphization of the lower region is carried out while then using the upper region in which the crystalline structure has been conserved to recrystallize this lower region makes it possible to obtain a better strain transfer than a method in which the opposite is done, i.e. rendering amorphous an upper region while then using a lower region in which the crystalline structure has been conserved to recrystallize the upper region.

The strain zones may then be removed.

An amorphous strained material to form the first strain zone and the second strain zone makes it possible to be able to strain different types of semi-conductor materials, such as for example Si, Ge, SiGe, InP, GaAs.

The use of an amorphous material also makes it possible to be able to form strain zones of high thickness and which is not limited by phenomena of plastic relaxation as with a crystalline material. This thus makes it possible to have a higher volume ratio between the strain zone and the strained semi-conductor block, thus better transfer of strains or deformations from the strain zone to the semi-conductor block.

Such a method can also make it possible to carry out the recrystallization and straining of the first block and of the second block at the same time or simultaneously.

The first strain state of the first semi-conductor block may be a compressive strain state, whereas the second strain state of the second semi-conductor block may be a tensile strain state.

The first block and said second block formed at step a) may be advantageously based on the same semi-conductor material. This semi-conductor material may be for example Si or Ge.

Thus, with a method according to the invention it is possible to form blocks of semi-conductor materials strained according to different types of strain, while limiting the number of steps and the cost of the method.

The amorphous strained material may be advantageously based on silicon nitride, titanium nitride, or carbon.

Such a method also makes it possible to limit the number of steps of growth by epitaxy.

According to a particular implementation of the method, between step a) and step b), at least one thermal annealing is carried out at a temperature below the recrystallization temperature of the amorphous semi-conductor material and adapted to enable straining of the upper crystalline non-amorphized region of the semi-conductor block prior to the recrystallization of the regions rendered amorphous.

By means of such an annealing, it is possible to modify more the level of deformation in the semi-conductor blocks.

According to a particular aspect of the method, the amorphization of said lower region of said first block may be carried out simultaneously or at the same time as that of said second block.

According to a first implementation possibility, step a) may comprise at least one amorphizing ionic implantation of said lower region of said first block and of said second block.

This implantation is then carried out so as to conserve the crystalline structure of said upper region of said first block and of said second block.

According to a second implementation possibility, step a) may comprise an etching of a stack formed of a layer of crystalline semi-conductor material resting on a layer of amorphous semi-conductor material.

This stack may have been formed beforehand by:
forming a layer of amorphous semi-conductor material on a layer of crystalline material of a first substrate,
bonding said layer of amorphous semi-conductor material onto a superficial insulating layer covering a second substrate.

After bonding, a thickness of the first substrate may be removed.

The layer of amorphous semi-conductor material on the first substrate may be formed by deposition or by amorphizing ionic implantation of a layer of crystalline semi-conductor material.

The formation of said first strain zone and/or of the second strain zone may comprise the steps of:
deposition of a layer of strained material on said first block and on said second block,
formation of a masking covering a given block among the first block and the second block covered with the strained material, an opening of the masking revealing the other block among the first and the second block,
etching of this other block through the opening of the masking.

According to an implementation variant of the method in which said substrate is a tensile strained semi-conductor on isolator type substrate, the first strain state in said first block may be such that the first block is relaxed or compressive strained whereas the second strain state in said second block is such that the second block is tensile strained.

The present invention also relates to a semi-conductor structure formed of a substrate comprising a support layer, an insulating layer resting on the support layer and on and in contact with the insulating layer, a first semi-conductor block compressively strained in the plane or relaxed and a second semi-conductor block tensile strained in the plane, the first semi-conductor block and the second semi-conductor block being and based on the same semi-conductor material.

The first block and the second block may belong to a same layer.

In a variant, the first block and the second block may be separate.

The present invention moreover provides a microelectronic device comprising a semi-conductor structure as defined above with at least one channel of a P-type transistor formed in the first semi-conductor block and at least one channel of an N-type transistor formed in the second semi-conductor block.

BRIEF DESCRIPTION OF THE DRAWINGS

The present invention will be better understood on reading the description of examples of embodiment given by way of indication and in no way limiting, and by referring to the appended drawings in which:

FIGS. 5A-5B illustrate an example of method for producing strain zones;

As is usual in the representation of semi-conducting structures, the various sectional views are not drawn to scale. The different parts represented in the figures are not necessarily according to a uniform scale, in order to make the figures easier to read. Moreover, in the following description, terms which depend on the orientation of the structure, such as "lower", "upper", apply in considering that the structure is oriented in the manner illustrated in the figures.

DETAILED DESCRIPTION OF PARTICULAR EMBODIMENTS

A first example of method, according to the invention, will now be described in conjunction with FIGS. 1A-1G and 5A-5B.

The starting material for this method is a semi-conductor on insulator type substrate, and may be for example of SOI (SOI for "silicon on insulator") type.

The substrate 1 thus comprises a support layer 10 for example semi-conducting, which may be based on Si, as well as an insulating layer 11, for example based on silicon oxide, which is situated on and in contact with the support layer 10. The insulating layer 11 may be for example of BOX (BOX for "Buried Oxide") type with a thickness (measured in a direction parallel to the z axis of an orthogonal reference point [O;x;y;z] given in FIG. 1A) for example comprised between 10 nm and 100 nm.

Figure 1A:
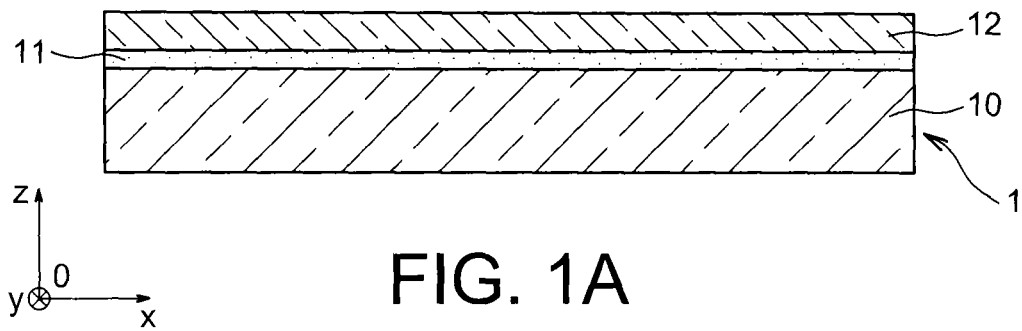
FIGS. 1A-1G and 5A-5B illustrate an example of method according to the invention, making it possible to form a semi-conductor on insulator type substrate provided on the surface with strained semi-conductor blocks based on the same semi-conductor material and resting on the insulating layer of the substrate, one or more first block(s) being tensile strained, whereas one or more second block(s) are compressive strained, or relaxed.

The substrate 1 further comprises a superficial semi-conducting layer 12 situated on and in contact with said insulating layer 11. This superficial semi-conducting layer 12 may have a thickness for example comprised between 5 nm and 50 nm (FIG. 1A).

Figure 1B:
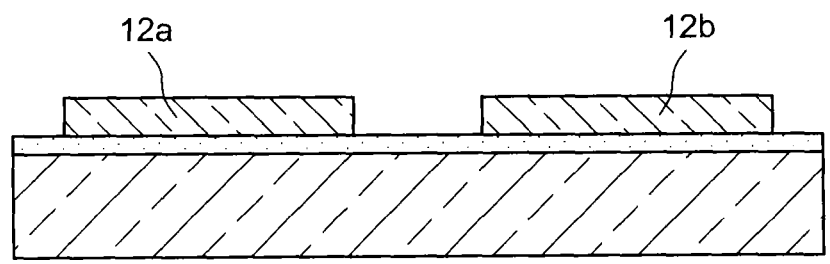
Figure 1C:
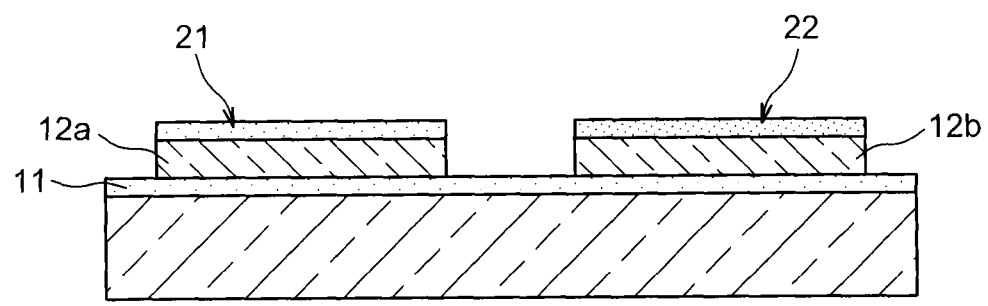

Firstly in the superficial semi-conducting layer 12 are formed several separate blocks 12a, 12b by etching while using the insulating layer 11 as stop layer. The blocks 12a, 12b are intended to form one or more active zones making it possible to accommodate components or parts of components, for example transistors. The etching of the blocks 12a, 12b may be carried out for example by means of TMAH (for "tetra methyl ammonium hydroxide"), for example in the case where the blocks 12a, 12b are based on silicon (FIG. 1B).

Then (FIG. 1C), on a first semi-conductor block 12a is formed a first straining zone 21 also called "strain zone" and intended to induce in the first semi-conductor block 12a a first type of strain, for example to compressive strain the first semi-conductor block 12a, whereas on a second semi-conductor block 12b, a second straining zone 22 also called "strain zone" is formed and intended to induce in the second semi-conductor block 12b a second type of strain, for example to apply tensile strain in the second semi-conductor block 12b.

The first strain zone 21 may be itself based on an amorphous material having an intrinsic elastic tensile strain whereas the second strain zone 22 is based on an amorphous material having an intrinsic elastic compressive strain.

The strain exerted on the blocks 12a, 12b is not here imposed by a crystalline material having a lattice parameter different to that of the semi-conductor material of the blocks 12a, 12b.

The first strain zone 21 and the second strain zone 22 may be based on a strained amorphous material such as for example silicon nitride, or titanium nitride, or carbon of DLC (DLC for "Diamond like Carbon") type or tetrahedral amorphous carbon (ta-C).

Figure 5A:
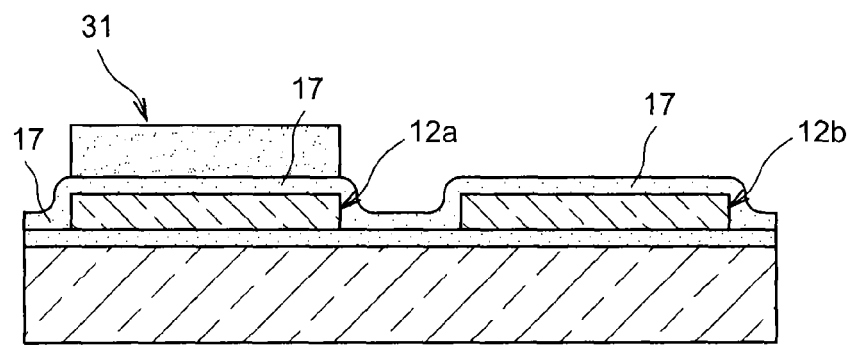
Figure 5B:
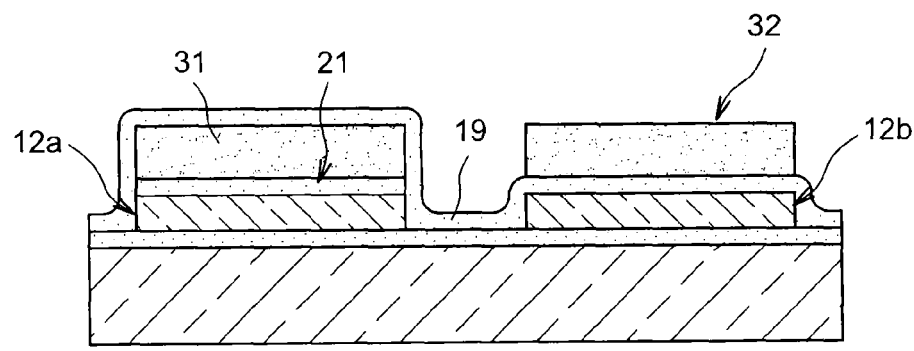

An example of method for producing strain zones is given in FIGS. 5A-5B.

The first strain zone 21 may be formed firstly by deposition of a first layer 17 based on strained amorphous material formed so as to cover the insulating layer 11 and the semi-conductor blocks 12a, 12b. The first layer 17 may be for example based on tensile strained $Si_xN_y$ and adapted to induce in the first semi-conductor block 12a a compressive strain. The first layer 17 may have a thickness comprised for example between 10 nm and 200 nm and a nominal strain for example of the order of 2 GPa.

Then, a first masking 31 is formed covering the first block 12a and which comprises an opening revealing the second block 12b (FIG. 5A). The first strain layer 17 is then etched through the opening(s) of the first masking 31 so as to conserve a strain zone 21 only on the first block 12a.

The second strain zone 22 is then formed, by depositing a second layer 19 based on strained amorphous material for example based on compressive strained $Si_xN_y$, and adapted to induce in the second semi-conductor block 12b a tensile strain. The second strain layer 19 may have a thickness comprised for example between 10 nm and 200 nm and a nominal strain for example of the order of 2 GPa.

This deposition is carried out so as to cover the insulating layer 11 and the semi-conductor block 12b. The second layer 19 based on strained amorphous material may also cover the first masking formed above the first block 12a.

Then, a second masking 32 is formed covering the second block 12b (FIG. 5B). The second layer 19 is then etched through the opening(s) of the first masking 31 and of the second masking 32 so as to conserve a strain zone 22 uniquely on the second block 12b and the strain zone 21 uniquely on the first block 12a. The maskings 31, 32 are then removed.

Then (FIG. 1D), what is termed a "buried" amorphization of the semi-conductor blocks 12a, 12b is carried out, so as to render amorphous regions 13a, 13b situated in the lower part of the blocks 12a, 12b respectively under other regions 14a and 14b situated in the upper part of the blocks 12a, 12b in which the crystalline structure is conserved.

The lower regions 13a, 13b rendered amorphous of the blocks 12a, 12b, may extend respectively under the crystalline regions 14a, 14b up to the insulating layer 11 of the substrate 1, whereas the upper regions 14a, 14b in which the crystalline structure has been conserved extend respectively between the amorphous lower regions 13a, 13b and the strain zones 21, 22.

The amorphization of the regions 13a and 13b may be carried out by means of at least one step of ionic implantation. In this embodiment example, the amorphizing implantation of the semi-conductor material of the semi-conducting regions 13a, 13b is implemented for example by means of Si or Ge, for example according to a dose comprised between $1^E14$ and $1^E15$ and an energy comprised between 10 keV and 100 keV.

Figure 1D:
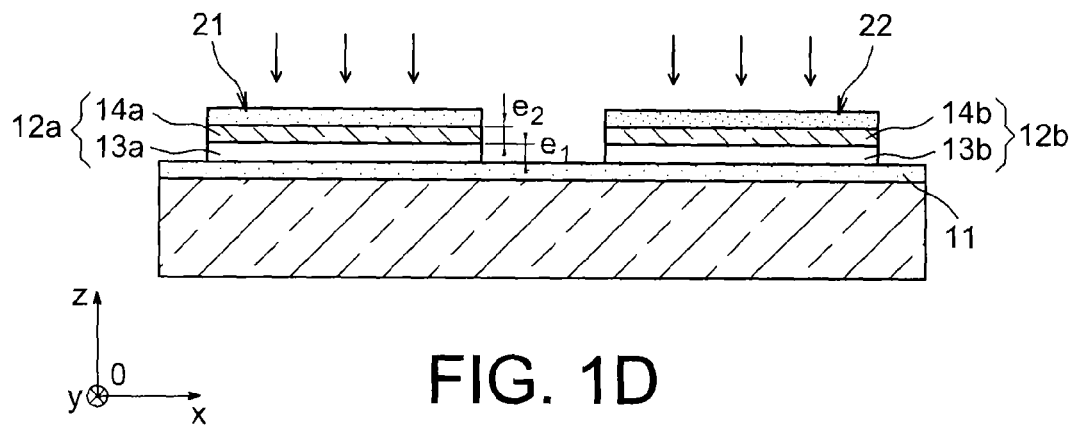

The regions rendered amorphous 13a, 13b may have a thickness $e_1$ comprised for example between 50% and 95% of the total thickness $e_1+e_2$ of the blocks 12a, 12b, whereas the crystalline regions 14a, 14b may have a thickness $e_2$ comprised for example between 50% and 5% of the total thickness $e_1+e_2$ of the blocks 12a, 12b (the thicknesses being measured in a direction parallel to the z axis of the reference point [O,x,y,z] given in FIG. 1D).

As an example, a block of Si of 33 nm thickness may have a region rendered amorphous between 70% and 80% of its lower thickness by ionic implantation of Si+ at an energy of 20 keV and a dose of $3.5*10^{14}$ atoms/cm$^2$.

The upper regions 14a, 14b in which the crystalline structure has been conserved extend respectively between the lower amorphous regions 13a, 13b and the strain zones 21, 22.

The strain zones 21, 22 arranged on and in contact with respectively, the upper crystalline region 14a of the first block 12a and the upper crystalline region 14b of the second block 12b make it possible to induce an important strain in the plane in the material of these upper regions 14a, 14b.

A recrystallization of the regions 13a, 13b of the blocks 12a, 12b (FIG. 1E) is then carried out.

To do so, at least one thermal annealing is carried out at a temperature comprised for example between 450° C. and 1300° C., for a duration comprised for example greater than 0 s and less than 1 h.

Vertical recrystallization fronts heading respectively from upper crystalline regions 14a, 14b up to the insulating layer 11 are thereby created.

In so far as the lower regions 13a, 13b of the blocks 12a, 12b rest on an amorphous layer, it is the crystalline regions 14a, 14b, strained respectively by the strain zones 21 and 22, which impose their respective lattice parameter on the lower regions 13a, 13b of the blocks 12a, 12b during the recrystallization. The crystalline regions 14a, 14b thus impose a lattice parameter deformed in the plane to the underlying recrystallized regions 13a, 13b.

Because of their proximity to the strain zones 21, 22, the crystalline regions 14a, 14b are those of the blocks 12a, 12b, which are subjected to the greatest lattice parameter deformations. At the end of the recrystallization (FIG. 1F), respectively compressive and tensile strained blocks 12a, 12b are thereby obtained, and in which the respective strains are greater than those undergone just after the step of forming strain zones 21 and 22 described previously in conjunction with FIG. 1C.

Figure 1E:
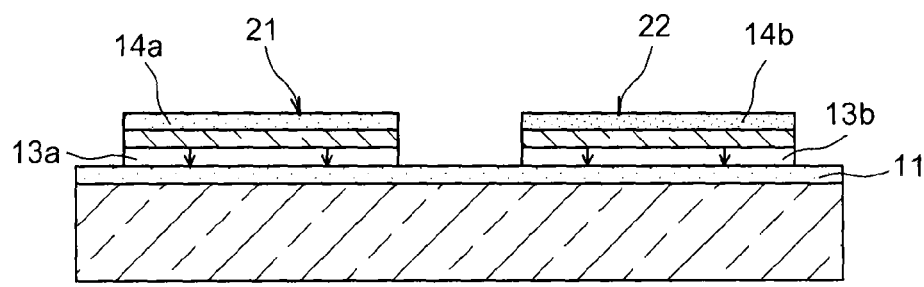
Figure 1F:
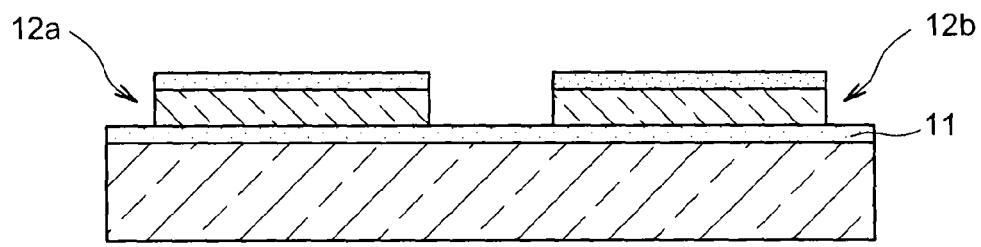
Figure 1G:
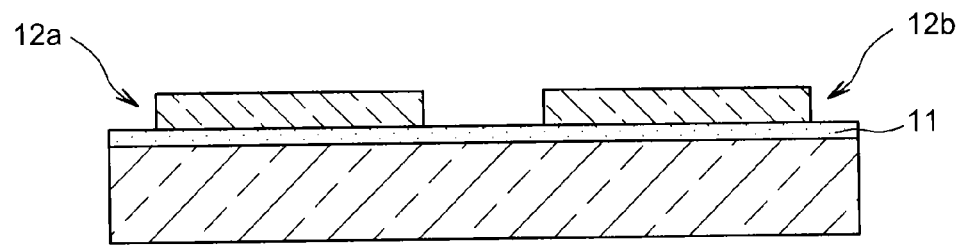

Then, the strain zones 21, 22 may be removed (FIG. 1G).

The blocks 12a, 12b then conserve respectively a compressive strain and a tensile strain.

From the blocks 12a, 12b, it is then possible to form at least one first P-type transistor $T_1$, for example of PMOS or PFET type, in which the channel is provided in the compressive strained first block 12a and at least one second N-type transistor $T_2$, for example of NMOS or NFET type, in which the channel is provided in the tensile strained second block 12b.

Figure 6:
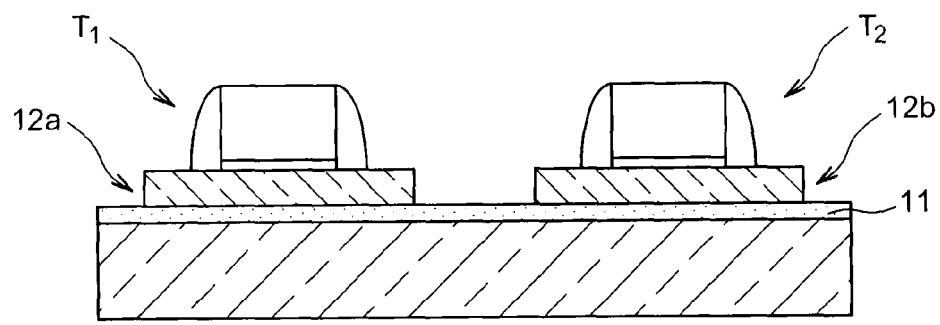
FIG. 6 illustrates a device with transistors formed by means of a method according to the invention, with a P-type transistor formed in a compressive strained semi-conductor block and an N-type transistor formed in a tensile strained semi-conductor block.

The channels of the transistors $T_1$ and $T_2$ are then formed in a same semi-conductor material, in this example Si (FIG. 6).

According to a variant of the example of method that has just been described, after the step of amorphization of the regions 13a, 13b of the blocks 12a, 12b and prior to the recrystallization annealing described in conjunction with FIG. 1E, at least one annealing may be provided beforehand at a temperature provided below the crystallization temperature of the semi-conductor material of the blocks 12a, 12b.

This annealing may be carried out at a temperature comprised for example between 280° C. and 400° C., for a duration comprised for example between 30 s and 5 h.

One or more annealings prior to the step of recrystallization may make it possible to increase in the end the strain induced in the blocks 12a, 12b.

A device as illustrated in FIG. 1F comprising on and in contact with the insulating layer 11 of a semi-conductor on insulator type substrate, a first compressive strained semi-conductor block 12a and a second tensile strained semi-conductor block 12b and based on the same semi-conductor material as the first block, may be formed by following a sequencing of steps having a different order to that which has been given.

Figure 2A:
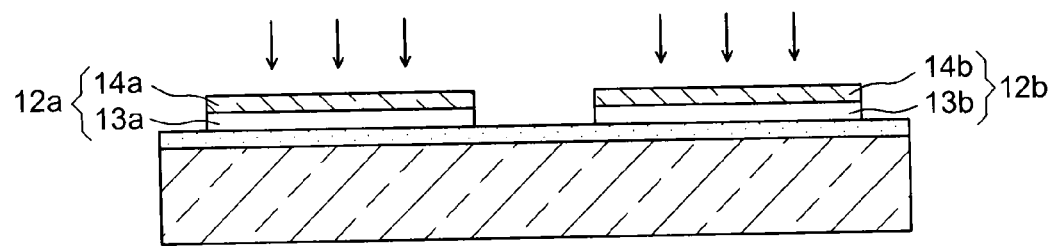
FIGS. 2A-2B illustrate an embodiment variant in which an amorphization is carried out of the lower part of semi-conductor blocks arranged on a semi-conductor on insulator substrate, then straining zones are formed to induce a strain in these blocks, before recrystallizing the lower part of the blocks in order to carry out therein a transfer of the lattice parameter deformed in the plane of a non-amorphized upper part of the blocks.
Figure 2B:
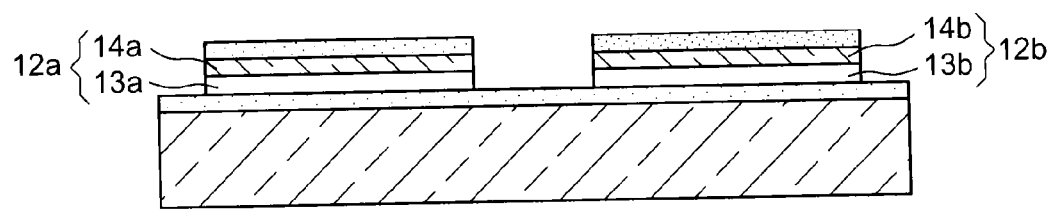

For example, according to an advantageous variant (FIGS. 2A-2B) of the method that has just been described, the step known as buried amorphization (FIG. 2A) may be carried out before that consisting in forming the strain zones 21, 22 respectively on the regions 14a, 14b of the blocks 12a, 12b that have not been rendered amorphous and in which the crystalline structure has thus been conserved (FIG. 2B).

According to another variant (FIGS. 3A-3B) of the examples of method that have just been given, the step of formation of the strain zones 21, 22 may be carried out before that of etching of the semi-conducting layer 12 of the substrate.

Figure 3A:
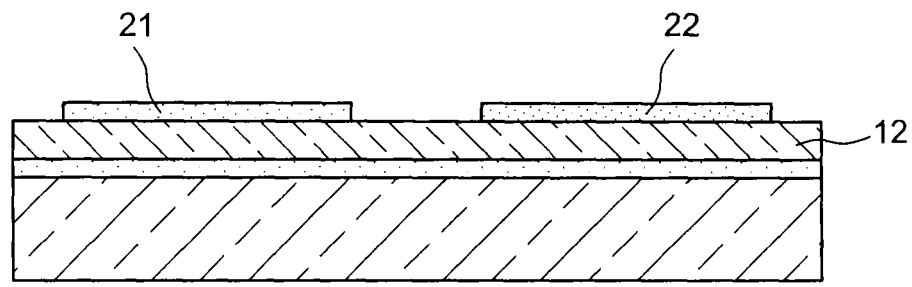
FIGS. 3A-3B illustrate another variant in which different strain zones are formed on a same superficial semi-conducting layer of a semi-conductor on insulator substrate.

The first strain zone 21 is thus formed on a zone of the superficial semi-conducting layer 12 of the substrate, and the second strain zone 22 on another zone of this superficial semi-conducting layer 12 (FIG. 3A).

Figure 3B:
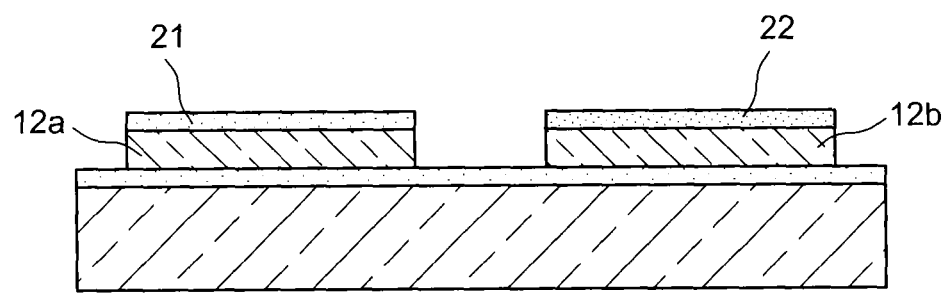

Then, an etching of the superficial semi-conducting layer 12 of the substrate is carried out between the strain zones 21 and 22, so as to form the separate semi-conductor blocks 12a, 12b resting on the insulating layer 11 of the substrate (FIG. 3B). The etching may be carried out for example by means of TMAH when the layer 12 is based on Si.

According to another embodiment example given in FIGS. 4A-4G, the amorphized regions 13a, 13b of the semi-conductor blocks 12a, 12b, may be formed before the step consisting in delimiting these blocks by etching of the superficial semi-conducting layer 12 of a substrate.

Figure 4A:
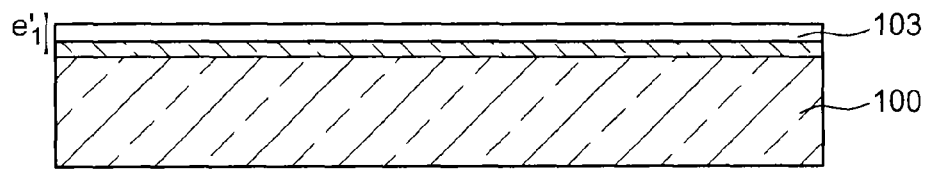
FIGS. 4A-4G illustrate another variant in which is formed on a layer of crystalline semi-conductor material a layer of amorphous semi-conductor material that is placed side by side with an insulating layer in order to form a semi-conductor on insulator type substrate in which the superficial semi-conducting layer is formed of a lower sub-layer based on amorphous semi-conductor material and of an upper sub-layer based on crystalline semi-conductor material.
Figure 4B:
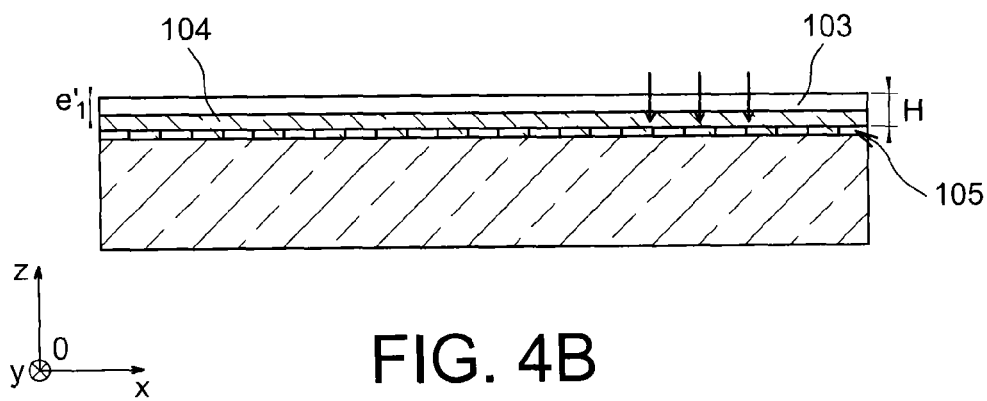
Figure 4C:
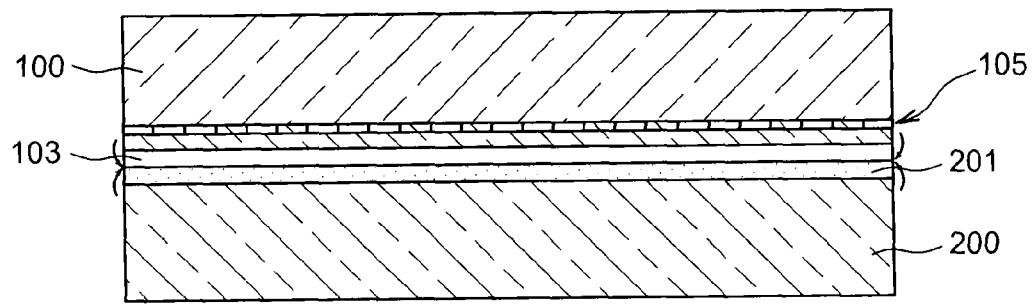

In this way is formed firstly, on a support 100, for example a bulk substrate based on crystalline Si, a layer of amorphous semi-conductor material 103, in particular a layer of amorphous Si (FIG. 4A).

This layer of amorphous semi-conductor material 103 may be formed by amorphization, for example by carrying out an ionic implantation of a superficial layer of the substrate 100, or by deposition of a layer of amorphous semi-conductor material on the substrate 100.

The layer of amorphous semi-conductor material 103 may have a thickness $e'_1$ (measured in a direction parallel to the z axis of the orthogonal reference point [O;x;y;z] given in FIG. 4A) for example comprised between 5 nm and 200 nm.

Then, a fragilization zone 105 is formed in the substrate 100, for example by carrying out an implantation of hydrogen as implemented in a method of type commonly called smart Cut™.

The implantation is carried out to a depth H (measured in a direction parallel to the z axis in FIG. 4B from an upper face also called front face of the substrate 100 through which the implantation is carried out) greater than the thickness $e'_1$ of the layer of amorphous semi-conductor material, so as to conserve a layer of intact crystalline semi-conductor material 104 of non-zero thickness between the layer rendered amorphous 103 and the fragilization zone 105.

The layer of amorphous semi-conductor material 103 of the substrate 100 is then bonded (FIG. 4C) with a superficial insulating layer 201, for example based on SiO$_2$, of another substrate 200. This bonding is carried out preferably at a temperature chosen below a given threshold, which depends especially on the type of semi-conductor material 103 rendered amorphous, so as to prevent recrystallization of this semi-conductor material 103. The temperature at which the bonding is carried out may be for example chosen below 500° C.

Figure 4D:
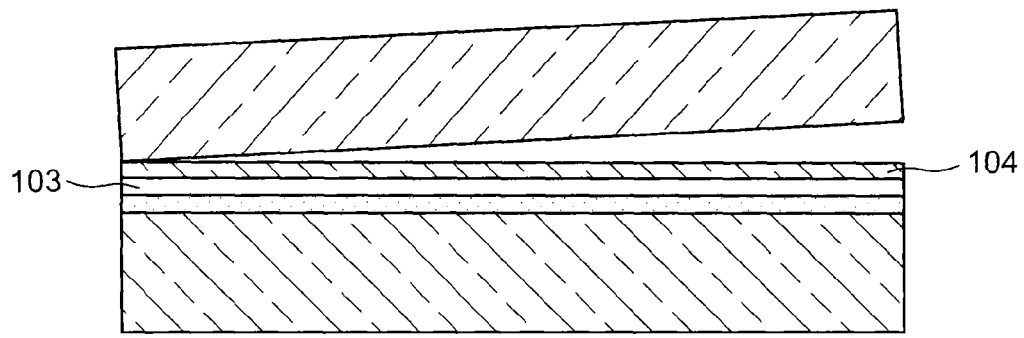

An annealing is then carried out at a temperature below said given threshold, for example 500° C., and a fracturing of the substrate 100 is carried out at the level of its fragilization zone 105, so as to conserve only the semi-conducting layer 104 of the substrate 100 in contact with the layer of amorphous semi-conductor material 103, the remainder of the substrate 100 being removed (FIG. 4D).

A step of planarization, for example by chemical mechanical polishing (CMP) may then be carried out to reduce the thickness of the semi-conducting layer 104.

Figure 4E:
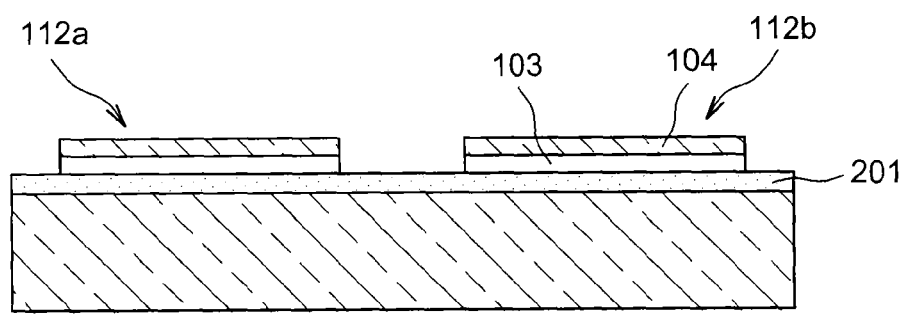

Then, separate blocks 112a, 112b are formed by etching of the layer of crystalline semi-conductor material 104 and of the layer of amorphous material 103 until the insulating layer 201 is reached (FIG. 4E).

Figure 4F:
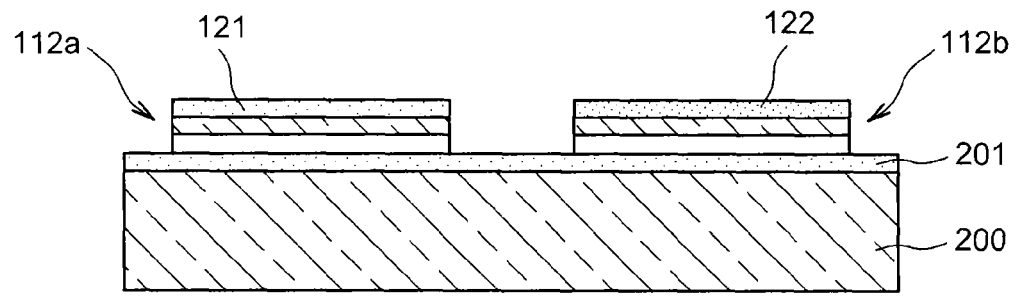

On a first semi-conductor block 112a, a first zone strain 121 is formed, for example based on tensile strained silicon nitride, adapted to induce a compressive strain in this first block 112a, whereas on a second block 112b, a second zone strain is formed, for example based on compressive strained silicon nitride, adapted to induce a tensile strain in the second block 112b (FIG. 4F).

Figure 4G:
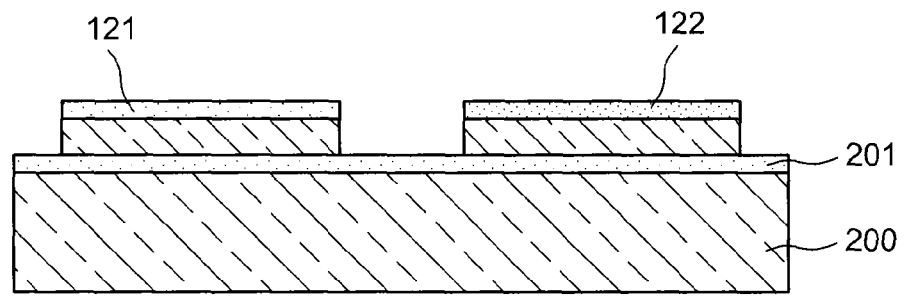

Then, a recrystallization is carried out of regions of amorphous semi-conductor material 103 of the blocks 112a, 112b while using zones of the layer of crystalline semi-conductor material 104 as starting zone for a recrystallization front. The recrystallization of the blocks 112a, 112b also makes it possible to transfer the lattice parameter from their upper part based on crystalline semi-conductor material undergoing a strain exerted by the zones 121, 122, to their lower part (FIG. 4G).

A method as implemented according to the invention is not limited to the straining of silicon blocks and may apply to other semi-conductor materials such as Ge, $Si_xGe_{1-x}$, InP, GaAs.

Figure 7A:
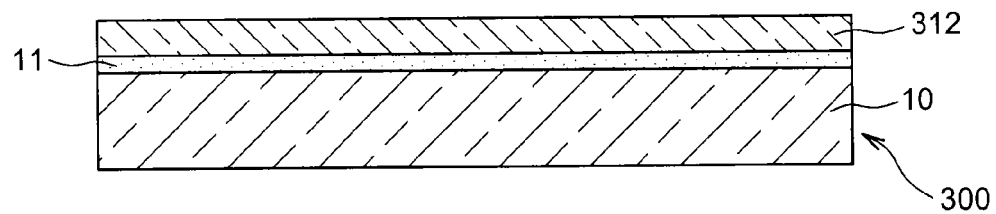
FIGS. 7A-7E illustrate another embodiment variant making it possible to form, from a strained semi-conductor on isolator type substrate, a relaxed or compressive strained semi-conductor block and a tensile strained semi-conductor block resting on the insulating layer of the substrate.

A method as described previously in conjunction with FIGS. 1A-1G can also be implemented by means of a strained semi-conductor on insulator substrate 300 (FIG. 7A), in particular of sSOI (for "strained Silicon On Insulator") type provided with a superficial semi-conducting layer 312 based on Si which is strained, for example tensile strained, and situated on and in contact with the insulating layer 11 of the substrate 300.

Figure 7B:
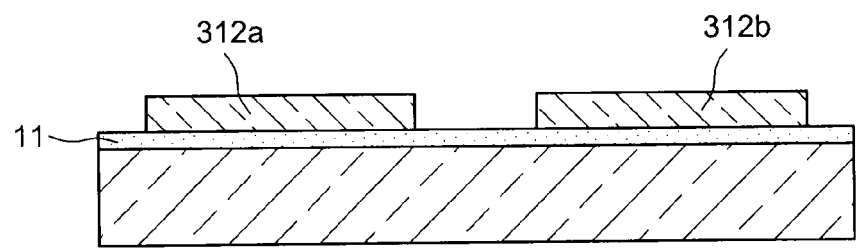
Figure 7C:
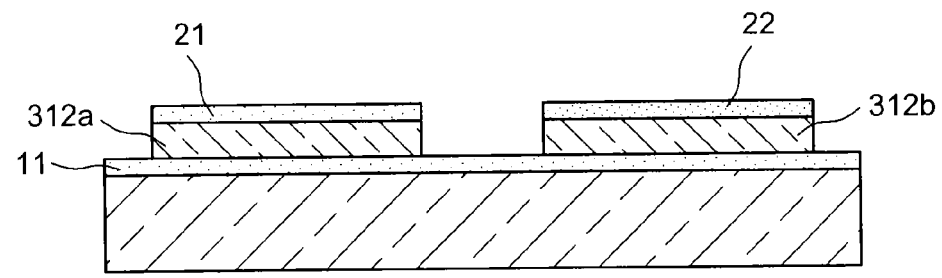

In the strained superficial semi-conducting layer 312 a first block 312a and a second block 312b (FIG. 7B) are formed, then on the first semi-conductor block 312a a first strain zone 21 is formed whereas on the second semi-conductor block 312b, a second strain zone 22 is formed (FIG. 7C).

The first strain zone 21 may be formed of amorphous material such as for example $Si_xN_y$, having an intrinsic tensile strain having a tendency to oppose the initial tensile strain of the first block 312a.

The second strain zone 22 may, for its part, be formed of compressive strained amorphous material such as for example $Si_xN_y$. The second strain zone 22 may thus make it possible to increase the initial strain of the second block 312b.

Figure 7D:
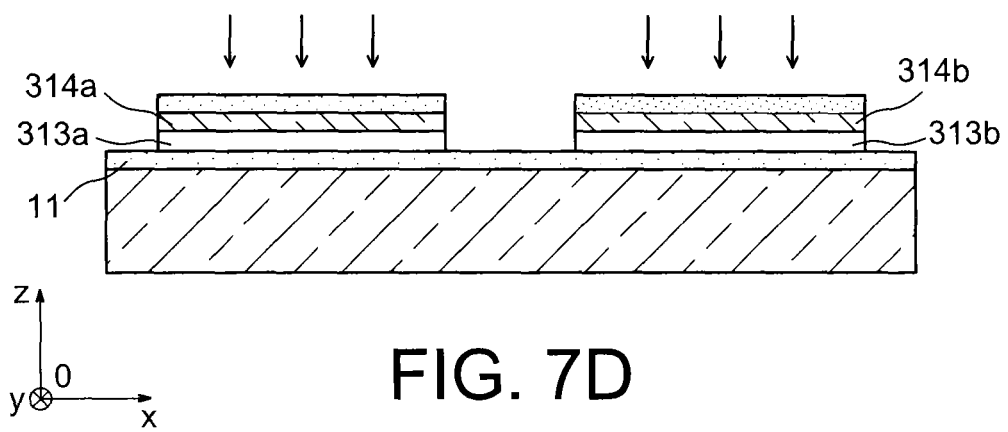
Figure 7E:
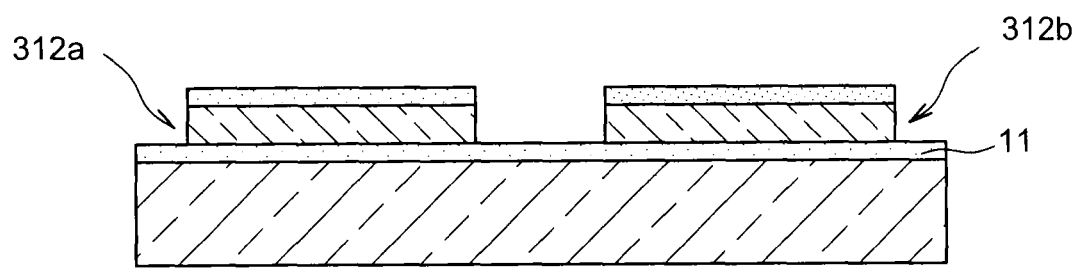

Then, a step of buried amorphization of the semi-conductor blocks 312a, 312b (FIG. 7D) is carried out, so as to render amorphous the lower regions 313a, 313b of the blocks 312a, 312b respectively under other upper regions 314a, 314b of the blocks 312a, 312b and in which the crystalline structure is conserved.

A recrystallization of the semi-conductor blocks 312a, 312b is then carried out. During this recrystallization, the upper regions 314a, 314b of the blocks 312a, 312b which are situated directly under the strain zones 21 and 22 impose their lattice parameter on the lower regions 313a, 313b.

It is thus possible to obtain, after recrystallization, a semi-conducting structure in which the second semi-conductor block 312b is tensile strained and in which the first semi-conductor block 312a is relaxed or compressive strained as a function especially of the intrinsic level of strain of the material of the first strain zone 21, and thus of the initial strain state of the first semi-conductor block 312a before amorphization.

According to another variant of one or the other of the examples of method that have just been described, it is possible to carry out the steps of amorphization of the first block and of the second semi-conductor block, then recrystallization of said lower region of the first block and of said second block while using said upper region of crystalline material as starting zone for a recrystallization front, without carrying out etching of the layer in which these blocks are situated.

The invention claimed is:

1. A method, comprising:
   a) forming on an insulating layer of a semi-conductor on insulator type substrate, a first semi-conductor block covered with a first stressor zone based on a tensile strained amorphous material configured to induce a first strain state in said first block and a second semi-conductor block covered with a second stressor zone based on a compressive strained amorphous material configured to induce a second strain state in said second block, the first block and the second block each being formed of a lower region based on amorphous semi-conductor material, the lower region being covered with an upper region of crystalline semi-conductor material, the upper region of said first block being in contact with said first stressor zone, the upper region of said second block being in contact with said second stressor zone; and
   b) recrystallizing said lower region of said first block and said lower region said second block while using said upper region of crystalline material as starting zone for a recrystallization front.

2. The method according to claim 1, wherein step a) is carried out by an amorphizing implantation of the lower region of the first block and of the second block, said implantation being carried out so as to conserve the crystalline structure of said upper region.

3. The method according to claim 1, wherein step a) further comprises an etching of a stack formed of a layer of crystalline semi-conductor material resting on a layer of amorphous semi-conductor material.

4. A method, comprising:
   a) forming on an insulating layer of a semi-conductor on insulator type substrate, a first semi-conductor block covered with a first stressor zone based on a tensile strained amorphous material configured to induce a first strain state in said first block and a second semi-conductor block covered with a second stressor zone based on a compressive strained amorphous material configured to induce a second strain state in said second block, the first block and the second block each being formed of a lower region based on amorphous semiconductor material, the lower region being covered with an upper region of crystalline semi-conductor material, the upper region of said first block being in contact with said first stressor zone, the upper region of said second block being in contact with said second stressor zone; and b) recrystallizing said lower region of said first block and said lower region said second block while using said upper region of crystalline material as starting zone for a recrystallization front, wherein:

step a) further comprises an etching of a stack formed of a layer of crystalline semi-conductor material resting on a layer of amorphous semi-conductor material, and said stack is formed beforehand by:

forming, by deposition or by amorphizing implantation, a layer of amorphous semi-conductor material resting on a layer based on crystalline material and belonging to a first substrate, and bonding said layer of amorphous semi-conductor material onto a superficial insulating layer covering a second substrate.

5. The method according to claim 1, wherein said amorphous strained material is based on $Si_xN_y$ or TiN or carbon.

6. The method according to claim 1, wherein the formation of the first stressor zone and/or of the second stressor zone comprises:

depositing a layer of strained material on said first block and on said second block, forming a masking covering a given block among the first block and the second block; an opening of said masking revealing another block among the first block and the second block, and etching said another block through the opening of the masking.

7. The method according to claim 1, wherein the first block and said second block are based on the same semi-conductor material.

8. The method according to claim 1, the first strain state in the first semi-conductor block being such that the first semi-conductor block is compressive strained, and the second strain state in said second block being such that the second semi-conductor block is tensile strained.

9. The method according to claim 1, wherein said substrate is a tensile strained semi-conductor on insulator type substrate, the first strain state in said first block being such that the first block is relaxed, and the second strain state in said second block being such that the second block is tensile strained.

10. The method according to claim 1, further comprising, between step a) and step b), at least one thermal annealing carried out at a temperature below a recrystallization temperature of the amorphous semi-conductor material.

* * * * *